(12) United States Patent
Xu et al.

(10) Patent No.: US 6,465,281 B1
(45) Date of Patent: Oct. 15, 2002

(54) METHOD OF MANUFACTURING A SEMICONDUCTOR WAFER LEVEL PACKAGE

(75) Inventors: DaXue Xu, North Plainfield, NJ (US); Henry G. Hughes, Scottsdale, AZ (US); Paul Bergstrom, Chandler, AZ (US); Frank A. Shemansky, Jr., New Hope, PA (US); Hak-Yam Tsoi, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 22 days.

(21) Appl. No.: 09/657,393

(22) Filed: Sep. 8, 2000

(51) Int. Cl.[7] .......................... H01L 21/44; H01L 23/22
(52) U.S. Cl. ...................... 438/127; 438/126; 257/687
(58) Field of Search ................................ 438/112, 106, 438/126, 128, 124, 123, 118, 125, 121, 127; 257/687, 693, 678, 680, 684, 727

(56) References Cited

U.S. PATENT DOCUMENTS

| | | | |
|---|---|---|---|
| 3,426,257 A | * 2/1969 | Youngquist | 174/52.1 |
| 5,323,051 A | * 6/1994 | Adams et al. | 257/417 |
| 5,326,726 A | 7/1994 | Tsang et al. | 437/228 |
| 5,628,100 A | 5/1997 | Johnson et al. | 29/25.41 |
| 5,637,802 A | 6/1997 | Frick et al. | 73/724 |
| 5,644,081 A | 7/1997 | Schwarz et al. | 73/493 |
| 5,747,931 A | * 5/1998 | Riddle et al. | 313/581 |
| 5,821,689 A | * 10/1998 | Andoh et al. | 313/243 |
| 6,247,987 B1 | * 6/2001 | Moore | 445/24 |

OTHER PUBLICATIONS

Y. Yoshii et al., "1 Chip Integrated Software Calibrated CMOS Pressure Sensor with MCU, A/D Convertor, D/A Convertor, Digital Communication Port, Signal Conditioning Circuit and Temperature Sensor", 1997 International Conference on Solid–State Sensors and Actuators, Transucers '97, Chicago—Jun. 16–19, 1997, Digest of Technical Papers, vol. 2, pp. 1485–1488.

S. Auder et al., "Integrated Sensor Wafer–Level Packaging", 1997 International Conference on Solid–State Sensors and Actuators, Transucers '97, Chicago—Jun. 16–19, 1997, Digest of Technical Papers, pp. 287–289.

S. Patel et al., "Characterization of Glass on Electronics in MEMS", Proceedings of SPIE—Materials and Device Characterization in Micromachining II, Santa Clara, CA, Sep. 1999, vol. 3875, pp. 73–78.

D. Xu et al., "The Process Development of Integrated Sensor Wafer–Level Packaging Using Thick Film Sealing Glass", SEMI—2nd Annual Semiconductor Packaging Symposium, SEMICON West 99, San Jose, CA, Jul. 13–14, 1999, pp. C1–C13.

* cited by examiner

*Primary Examiner*—Carl Whitehead, Jr.
*Assistant Examiner*—Brook Kebede
(74) *Attorney, Agent, or Firm*—Robert L. King; A. Kate Huffman

(57) ABSTRACT

A semiconductor wafer level package used to encapsulate a device fabricated on a semiconductor substrate wafer before dicing of the wafer into individual chips. A cap wafer may be bonded to the semiconductor substrate using a low temperature frit glass layer as a bonding agent. The frit glass layer is in direct contact with the device. A hermetic seal is formed by a combination of the semiconductor substrate wafer, the cap wafer and the frit glass layer. A second embodiment of the package does not contain a cap wafer.

7 Claims, 1 Drawing Sheet

METHOD OF MANUFACTURING A SEMICONDUCTOR WAFER LEVEL PACKAGE

FIELD OF THE INVENTION

This present invention relates to the wafer-scale packaging of monolithically integrated sensors and actuators and of integrated circuits in general.

BACKGROUND OF THE INVENTION

The advancement and miniaturization of integrated circuit technologies through the application of micromachining processes derived from standard microelectronic fabrication technologies has required the introduction of new packaging techniques to protect various elements of the sensor system from unwanted exposure during manufacturing or in the system application. Ideally, these techniques would be applied at the wafer scale, prior to die singulation, as has been described in U.S. Pat. No. 5,323,051. Wafer scale packaging provides significant enhancements for manufacturing and has resulted in the introduction of many micromachined sensor components more difficult or impossible to produce with other techniques.

The performance enhancement gained through the monolithic integration of control circuitry along with micromachined sensing elements again taxes the potential of wafer scale packaging techniques. Wafer scale packaging using a glass frit as the bonding medium requires temperatures not typically compatible with standard microelectronics processing for the bond process, and often involves frit materials containing elemental components deleterious to active circuitry. Even with the resolution of such limitations, neither performance nor area utilization is enhanced significantly if the wafer scale packaging requires unique bond areas.

Accordingly, there exists a need for a wafer level package in which glass frit may be formed in contact with active components of a semiconductor device. Further, such a semiconductor package, that may or may not contain a cap wafer, provides a reliable device without compromising the characteristics of the components.

SUMMARY OF THE INVENTION

This present invention provides a semiconductor wafer-level package in which glass frit is formed directly in contact with the devices or active circuitry in the monolithic device. This could be embodied using wafer bond or by direct application of glass frit to the devices. This package may be used to encapsulate a monolithically-integrated sensor structure, to protect an integrated circuit from unwanted exposure to environmental or electromagnetic interactions, or to create wafer-scale protected integrated circuits and systems for flip-chip packaging applications. A preferred embodiment includes a cap wafer bonded to the semiconductor substrate, which may include integrated circuits and sensors. This bond is formed using a pattern of frit glass as a pattern such that any sealed volumes formed by the cap wafer, frit glass, and semiconductor substrate are hermetically sealed. Integrated circuits (devices), can exist beneath the frit glass seal. Another preferred embodiment includes direct application of a pattern of glass frit to a semiconductor substrate such that regions of the substrate are hermetically sealed. Integrated circuits (devices) can exist directly beneath the frit glass.

BRIEF DESCRIPTION OF THE DRAWING

The present invention will be better understood from a reading of the following detailed description, taken in conjunction with the accompanying drawing figures in which.

Figure 1:
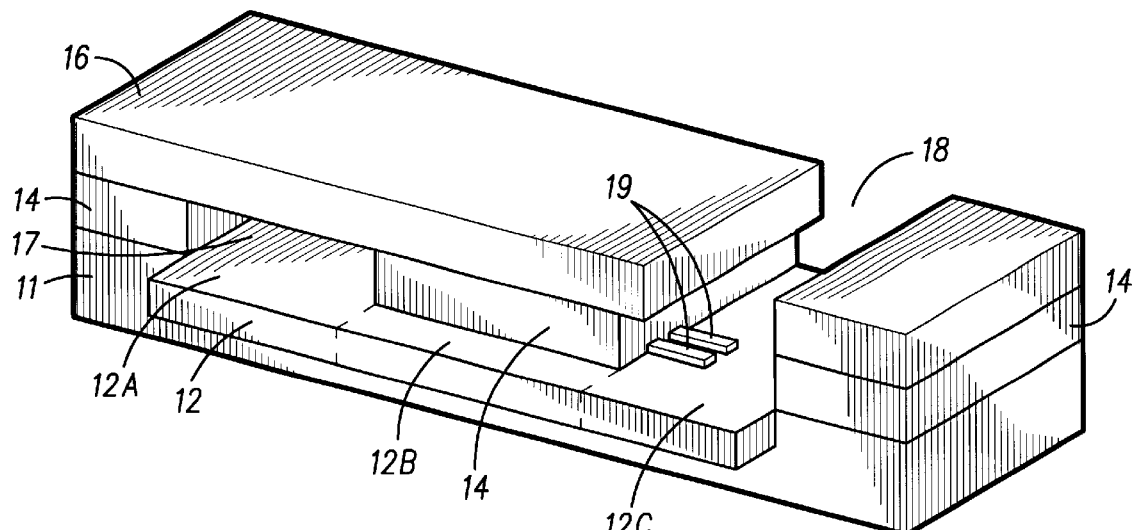
FIG. 1 shows a perspective cross-sectional view of a device encapsulated within a semiconductor wafer level package containing a cap wafer in accordance with a first preferred embodiment of the present invention.

For simplicity and clarity of illustration, the figures illustrate the general invention, and descriptions and details of well-known features and techniques are omitted to avoid excessive complexity. The figures are not necessarily drawn to scale, and the same reference numerals in different figures denote the same elements. It is further understood that the embodiments of the invention described herein are capable of being manufactured or operated in other orientations than described or illustrated herein.

DETAILED DESCRIPTION OF PREFERRED EMBODIMENTS

FIG. 1 shows a cross sectional view of a device 12, which is encapsulated in a wafer scale package 21 in accordance with the present invention. Typically a plurality of such devices together with external structures such as test devices and scribe channels will be fabricated as part of the total semiconductor wafer level package. For clarity, these well-known external structures are omitted from the drawing and only a portion of the semiconductor wafer level package 21, which contains device 12. The device 12 is fabricated on a semiconductor substrate wafer 11, which comprises a wafer of semiconductor material before the wafer has been diced into a plurality of distinct chips. Device 12 may be any of the devices, which are commonly fabricated using the semiconductor wafer. Typically such devices are integrated circuit structures, micromachined sensors such as accelerometers, and other micromachined structures. The device 12 nay be located in one or any of three regions in the package 21. The first location of a device 12a is inside a cavity 17 formed by the protective cap 16, the frit glass layer 14, and the substrate 11. A second location of a device 12b may be in a position beneath the frit glass 14 in which a sealing surface or the hermetic bond is formed with device 12b. Thirdly, a device 12c may be located outside the protective cap and will be exposed to external environments, electrical contacts, etc.

The cap wafer, which can be silicon, glass, metal, polymer, or the like, is provided which can be prepared by providing a plurality of holes, which extend completely through cap wafer. These holes, which are normally drilled or etched before bonding, may also be made after bonding. A frit glass is then typically deposited on the cap wafer by a silk screening method, which leads to a pattern aligned with the electrical patterns on the device wafer. Other methods of deposition may also be employed such as spin coating, spraying, direct write, etc. The preferred embodiment is to deposit slurry comprising a mixture of organic binder, solvent, and a frit glass containing filler, deposited through the silk screen. The combination is fired by heating to a high enough temperature to volatilize organic or inorganic materials. Selection and use of the binder as well as the subsequent firing comprise methods well known in the art of frit glass deposition. Then frit glass itself is selected to allow bonding below the temperature at which aluminum forms an alloy with silicon, approximately 570 degrees Celsius, and more importantly, at a low enough temperature not affect the functionality of the electronic devices which may contain integration on the same chip, such as an IC device and sensor.

Suitable glasses may be available from VIOX Corporation, Nippon Electric Glass America, Inc., Ferro Corporation, or others, but the practiced embodiment employs a glass, identified as VIOX Glass No. 24925, or VIOX Glass No. 24927 from VIOX Corporation.

The cap wafer is bonded to semiconductor substrate wafer using a frit glass layer in direct contact with the electronic device, frit glass serving as the bonding agent. Process conditions are such that the integrated circuitry, IC, and which can include sensing elements, are compatible so as not to degrade the performance and functionality of the integrated electronic devices. Specifically the range of softening temperatures for the frit glass material is less than about 500 degrees C., preferably about 300 degrees C. to about 475 degrees C. A preferred thickness of the frit glass layer is about 5 microns to about 4 mils, preferably about 5 microns to about 25 microns. Other glasses with lower bonding temperatures may be available, however, in which case it is understood that the glazing and bonding temperatures may be lowered.

Cap wafer 16 is bonded to semiconductor substrate wafer 11 using frit glass 14 as a bonding agent. This bonding comprises heating the cap wafer 16, frit glass 14, and semiconductor substrate wafer 11. In this way semiconductor wafer level package 21 is formed as part of a capped wafer structure with device 12 hermetically sealed of predetermined dimensions formed by a combination of semiconductor substrate wafer 11, cap wafer 16, and frit glass 14. Cap wafer 16 is formed from a material, which will form a suitable seal with the frit glass. Typical such materials are semiconductor wafers, such as silicon, II-VI or III-V compound semiconductors, quartz plates, alumina plates, certain metals, polymers, or the like. The material, which comprises cap wafer 16, may be selected to provide a desired thermal expansion characteristic. For example, a silicon wafer used for cap wafer 16 will inherently have virtually identical thermal properties with a similar silicon wafer, which is used for semiconductor substrate wafer 11. The compatibility of the frit glass material of the invention provides a means to hermetically seal the device on the semiconductor substrate by directly contacting the frit glass material to the device 12 without damage or ill effects to the device. The low temperature frit glass material of the invention may also be used to form frit glass walls by predetermining the pattern of the frit glass material prior to depositing it on the surface of the cap wafer 16.

A plurality of metal traces 19 may be fabricated on semiconductor substrate wafer 11, prior to the formation of the frit glass layer 14. Metal traces 19 form a seal with the frit glass 14 as shown in FIG. 1. Metal traces 19 form a plurality of electrodes on semiconductor substrate wafer 11, which provide electrical coupling to device 12. Prior to frit glass application, holes may be etched in cap wafer 16 in locations which provide ready access to a portion of the electrodes formed by metal traces 19. A plurality of traces 19 is bonded to a plurality of pads formed on device 12 in the opening 18. Wires (not shown) extend through the opening 18 and are themselves coupled to external leads. Wires through opening 18, and metal traces 19 provide a simple, inexpensive method to provide a plurality of desired electrical couplings to device 12 while allowing portions or all of device 12 to remain hermetically sealed under the cap wafer 16.

Cap wafer 16 and semiconductor substrate wafer 11 may be aligned optically by means of opening 18, and an appropriate alignment target formed on semiconductor substrate wafer 11. Alternatively a plurality of bonding pads formed as part of metal traces 19 are used for visual alignment. The capped wafer structure is then introduced into a controlled environment, which typically comprises an inert gas at a specified pressure such as helium, argon or nitrogen. While in the inert gas, cap wafer 16 and semiconductor substrate wafer 11 are heated to bond them together to form semiconductor wafer level package 21. The bonding hermetically seals the capped wafer structure. The controlled environment is possible which provides a predetermined damping action for mechanical motion of device 12. The predetermined damping action is readily controlled by altering the composition and pressure of the inert gas. The capped wafer structure is then diced into a plurality of composite chips by sawing, a method well known in the semiconductor art. The composite chips may then be further encapsulated, for example, within a plastic material or underfilled as is conventionally know in flip chip technology. The composite chips can also exist without further encapsulation.

While the above is an integrated device, which may contain several circuits, sensors, and other discrete integrated electrical components, alternative embodiments are possible. These can include device 12 being a device which is fabricated separately from semiconductor substrate wafer 11 then mounted on semiconductor substrate wafer 11, or other suitable substrate such as a glass plate. Other embodiments include device 12 comprising any of the devices, which are commonly fabricated using a semiconductor wafer. In these embodiments, device 12 may comprise integrated circuit structures, sensors such as accelerometers, and micromachined structures. Certain alternative embodiments deposit frit glass on a surface of semiconductor substrate wafer 11. Many embodiments combine a plurality of device structures within a cavity 17, for example an accelerometer with the associated control circuitry. Other alternative embodiments utilize alternative methods well known in the art to form frit glass bonding. These methods include defining the pattern of frit glass by photolithography. Still other methods for deposition of frit glass include: a syringe or needle, electrophoretic deposition, use of a centrifuge, direct glass paste injection through an orifice, spin coating, or spray coating.

Figure 2:
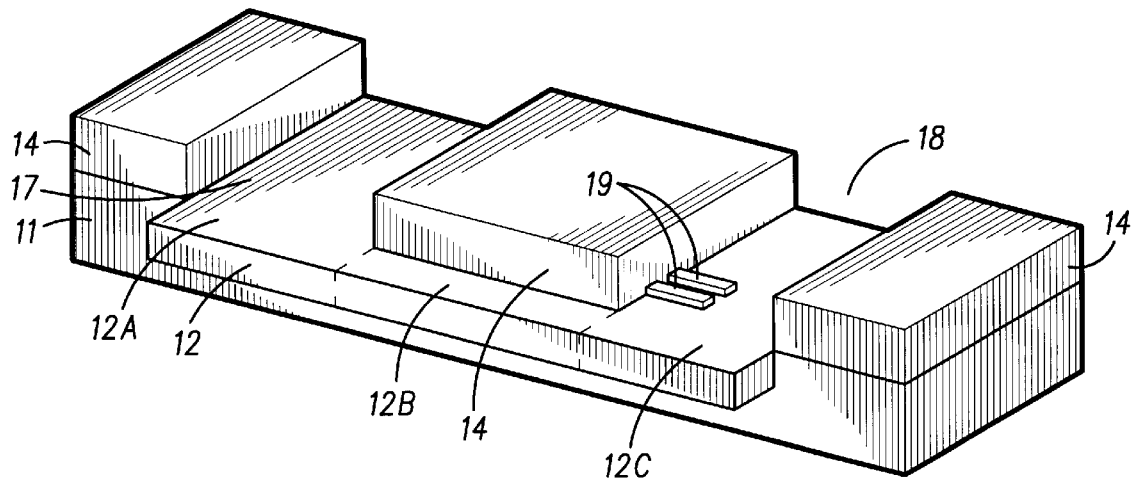
FIG. 2 illustrates a perspective cross-sectional view of an encapsulated device excluding a cap wafer in accordance with a second preferred embodiment of the invention.

A second preferred embodiment of the package 21 does not contain a cap wafer and is illustrated in FIG. 2. The package 21 is prepared as described except the step of forming a cap wafer is omitted. The frit glass is applied directly on the device and an opening is provided in the frit glass layer to provide access to the substrate of the wafer.

EXAMPLE

A whole cap wafer or cap wafer containing cavities was selected and a glass paste pattern printed on a surface of the cap wafer by screen printing. It may be appreciated that any conventional patterning technique may be used, such as screen printing, spin coating, direct dispense writing, or photolithographic techniques. The frit glass paste was dried on the cap wafer in an oven set at 80 degrees C. for 1 hour and for a second hour at 120 degrees C. The glass patterned wafers were removed from the drying oven and loaded into furnace boats. The wafers were glazed in a specified temperature program, i.e. 450 degree C. temperature for at least 30 minutes. Temperature range example: min. 420 degrees C. and max. 505 degrees C. The cap wafer was aligned to the device wafer in an Electronic Vision Model EV 450 Wafer Aligner in preparation for bonding of cap wafer to device wafer. In the wafer to wafer bonding step, the wafer was bonded in an Electronic Vision Model EV AB1PV Wafer Bonder Single Chamber at 430 degrees C. for 10 minutes. Wafers are typically bonded 20 to 30 degrees below the glazed wafer temperature.

In the second embodiment, a whole device wafer or device wafer containing cavities or recesses was selected and a glass paste pattern printed on a surface of the wafer by screen printing. Any conventional patterning technique may be used, such as screen printing, spin coating, direct dispense writing, or photolithographic techniques. The frit glass paste was dried on the wafer in an oven set at 80 degrees C. for 1 hour and for a second hour at 120 degrees C. The glass patterned wafers were removed from the drying oven and loaded into furnace boats. The wafers were glazed in a specified temperature program, i.e. 450 degree C. temperature for at least 30 minutes to volatilize the organic binder. Temperature range example: about 420 degrees C. and to 505 degrees C.

By now it should be clear that the present invention provides packaging devices which are fabricated on a semiconductor wafer before that wafer is diced into individual chips. The packages contain a hermetic seal by means of frit glass on electronics having thermal characteristics which closely match those of the device. The package is inexpensive to manufacture and provides for electrical connections to the device without compromising the other characteristics of the package.

We claim:

1. A method of producing a semiconductor wafer level package comprising:

fabricating at least one device with active circuitry on a semiconductor substrate wafer wherein the semiconductor substrate wafer has not been diced into a plurality of distinct chips;

depositing a predetermined pattern of a low temperature frit glass layer onto a cap wafer;

bonding the cap wafer to the semiconductor substrate wafer using the frit glass layer, the frit glass layer being a bonding agent which is in direct contact with the active circuitry of the at least one device such that the device is hermetically sealed in a chamber formed by a combination of the semiconductor substrate wafer, the cap wafer and the frit glass layer.

2. The method of claim 1 wherein the bonding step is performed at a softening temperature that is within a range of about three hundred degrees Celsius to about five hundred degrees Celsius.

3. The method of claim 1 further comprising:

implementing the cap wafer as a semiconductor wafer comprising a material selected from the group of a II-VI compound and a III-V compound.

4. A method of producing a semiconductor wafer level package comprising:

fabricating at least one device with active circuitry on a semiconductor substrate wafer wherein the semiconductor substrate wafer has not been diced into a plurality of distinct chips;

depositing a predetermined pattern of a low temperature frit glass layer onto a surface of the semiconductor substrate wafer such that a portion of the frit glass layer is in direct contact with the active circuitry of the at least one device;

providing at least one electrode formed on the surface of the semiconductor substrate wafer which provides electrical coupling to the device fabricated on the semiconductor substrate wafer; and fabricating an opening in the frit glass pattern to provide access to the portion of the substrate.

5. The method of claim 4 wherein the depositing step further comprises glazing the frit glass layer at a temperature in a range of about three hundred degrees Celsius to about five hundred degrees Celsius.

6. The method of claim 4 wherein the depositing step further comprises depositing the frit glass layer by a silk screening process.

7. A method of producing a semiconductor wafer level package comprising:

fabricating at least one device with active circuitry on a semiconductor substrate wafer wherein the semiconductor substrate wafer has not been diced into a plurality of distinct chips;

depositing a predetermined pattern of a low temperature frit glass layer onto a cap wafer; and bonding the cap wafer to the semiconductor substrate wafer using the frit glass layer, the frit glass layer being a bonding agent having a composition that is selected to allow bonding at a low enough temperature to not affect functionality of the active circuitry on the semiconductor substrate wafer, the frit glass layer being in direct contact with the active circuitry of the at least one device such that the device is hermetically sealed in a chamber formed by a combination of the semiconductor substrate wafer, the cap wafer and the frit glass layer.

* * * * *